United States Patent [19]

Suwa et al.

[11] Patent Number: 5,079,743

[45] Date of Patent: Jan. 7, 1992

[54] CIRCUIT FOR APPLYING SELECTED VOLTAGES TO DYNAMIC RANDOM ACCESS MEMORY

[75] Inventors: Makoto Suwa; Hiroshi Miyamoto; Shigeru Mori, all of Hyogo, Japan

[73] Assignee: Mitsubishi Denki Kabushiki Kaisha, Tokyo, Japan

[21] Appl. No.: 436,587

[22] Filed: Nov. 15, 1989

[30] Foreign Application Priority Data

Dec. 28, 1988 [JP] Japan .................. 63-332237

[51] Int. Cl.⁵ ................. G11C 7/00; G11C 11/40
[52] U.S. Cl. ..................... 365/149; 365/201
[58] Field of Search ............ 365/149, 190, 201, 226, 365/189.03, 189.09

[56] References Cited

U.S. PATENT DOCUMENTS

| 4,527,254 | 6/1985 | Ryan et al. | 365/51 |
| 4,839,865 | 6/1989 | Sato et al. | 365/226 |

FOREIGN PATENT DOCUMENTS 62-192998  8/1987  Japan .
62-232155 10/1987  Japan .
62-252598 11/1987  Japan .

OTHER PUBLICATIONS

Y. Ohji et al, "Reliability of Nano-Meter Thick Multi-Layer Dielectric Films of Poly-Crystalline Silicon", Symposium of International Reliability Physics, 1987, IEEE, pp. 55-59.

Primary Examiner—Joseph A. Popek
Assistant Examiner—Jack A. Lane
Attorney, Agent, or Firm—Lowe, Price, LeBlanc & Becker

[57] ABSTRACT

A dynamic random access memory (DRAM) includes a selection circuit for selecting the voltages used for aging. The switching circuit operates responsive to external control signals. When a source voltage (Vcc) is selected, the voltage (Vcc) is supplied to one electrode of a memory cell via a circuit 73 and a transmission gate while a ground potential (Vss) is supplied to the other electrode via a bit line and a transistor. Conversely, when the ground potential (Vss) is selected, an inverted voltage is applied across the two electrodes. In this manner, the insulating properties of an insulator interposed between the two electrodes can be checked more reliably during aging.

3 Claims, 7 Drawing Sheets

SELECTION CIRCUIT 80

CIRCUIT FOR APPLYING SELECTED VOLTAGES TO DYNAMIC RANDOM ACCESS MEMORY

BACKGROUND OF THE INVENTION

1. Field of the Invention

This invention relates in general to a dynamic random access memory device and, more particularly, to a dynamic random access memory which makes it possible to perform more effective aging.

2. Description of the Background Art

FIG. 4 is a block diagram showing an example of a conventional dynamic random access memory device, referred to hereinafter as DRAM. Referring to FIG. 4, this DRAM includes a memory array 58 composed of memory cells for storing data signals, an address buffer 54 for receiving address signals for selecting the memory cells, a row decoder 55 and a column decoder 56 for decoding the address signals, and a sense amplifier 63 connected to the memory array 58 and adapted for amplifying and reading signals stored in the memory cells. An input buffer 59 to which data signals $D_{in}$ are entered and an output buffer 60 from which data signals $D_{out}$ are outputted are connected to the memory array 58 via an I/O gate 57.

The address buffer 54 is connected for receiving external address signals ext. A0 to A9 or internal address signals Q0 to Q8 generated from a refresh counter 53. A refresh controller 52 is responsive to changing timing of $\overline{RAS}$ and $\overline{CAS}$ signals applied to a clock generator 51 to drive a refresh counter 53.

In addition to the above components, this DRAM further includes a cell plate voltage generator 71 for generating a voltage Vm to be applied to a cell plate of each memory cell, and a switching circuit 70 connected to receive a voltage Vm and a ground potential Vss and adapted for selectively outputting one of these voltages as a cell plate voltage Vcp. The switching circuit 70 operates in response to a control signal $\phi 1$. The signal $\phi 1$ is outputted by a selection signal detecting circuit 30 when a voltage higher than the supply voltage $V_{cc}$ is applied to any one of the address terminals. In another example, the signal $\phi 1$ is externally applied through a spare terminal without using the selection signal detecting circuit 30. However, if the DRAM has no spare terminal, the signal $\phi 1$ cannot be directly applied, since no terminal should be newly added for aging. It is noted that an external source voltage Vcc and the external ground voltage Vss are applied to this DRAM via terminals 61 and 62, respectively.

FIG. 5 is a circuit diagram showing a part of the memory cell array 58 and the switching circuit 70 shown in FIG. 4. The circuit shown in FIG. 5 may be seen in the Japanese Patent Laying-Open No. 252598/1987.

Referring to FIG. 5, the memory array 58 includes a large number of memory cells 8 each connected between a bit line 1 and a word line 2. Each memory cell includes an NMOS transistor 7 for switching and a capacitor 5 for holding the data signal voltage. Each capacitor 5 has its one electrode 5a connected for receiving the cell plate voltage Vcp from the switching circuit 70 and the other electrode 5b connected to the transistor 7. The capacitor 5 includes an insulator 5c between its two electrodes 5a and 5b. The transistor 7 is connected between the bit lie 1 and the other electrode 5b of the capacitor and has its gate connected to the word line 2.

The switching circuit 70 includes a transimission gate 13 connected for receiving the voltage Vm from the cell plate voltage generator 71 and a transmission gate 15 connected for receiving the ground voltage Vss. The transmission gate 13 includes a parallel connection of a PMOS transistor 12a and an NMOS transistor 12b. Similarly, the transmission gate 15 includes a parallel connection of a PMOS transistor 14a and an NMOS transistor 14b. Each of the transistors 12a and 14b has its gate connected to receive a control signal $\overline{\phi 1}$ and each of the transistors 12b and 14a has its gate connected to receive an inverted control signal $\overline{\phi 1}$. The control signals $\phi 1$ and $\overline{\phi 1}$ are supplied from a control circuit not shown in FIG. 5. The voltage Vm has a value equal to (Vcc−Vss)/2.

During the usual read out or write mode, 5 volts of Vcc and 0 volt of Vss are supplied. One of the word lines is brought to a high level by the row decoder 55 shown in FIG. 4, so that the associated transistor 7 is turned on. During the read out mode, the charges of data signal stored in the capacitor 5 are supplied to the associated bit line 1 via transistor 7. The sense amplifier 63 shown in FIG. 4 amplifies minute voltage changes in the bit line 1. The amplified signals are outputted via I/O gate 57 and the output buffer 60. During the write mode, data input signals applied from outside are transmitted to a selected one of bit lines 1 via input buffer 59 and I/O gate 57. The signal voltage on the bit line 1 is supplied to the other electrode 5b of the capacitors via the transistor 7 turned on by the row decoder 55.

During the above described usual read out and write modes, the voltage Vm (=(Vcc−Vss)/2) is supplied to the other electrode 5a of the capacitor 5 as the cell plate voltage Vcp. That is, the transmission gate 13 is turned on responsive to the signal $\phi 1$ to transmit the voltage Vm to the one electrode 5a of the capacitor in each memory cell 8.

As a rule, an aging test is performed before shipping of the DRAM. Aging is a test in which a device is moderately stressed for a certain period until its properties are stabilized in a constant state. In aging DRAMs, insulating properties of the insulator 5c in the capacitor 5 included in the memory cell 8 shown in FIG. 5 are ascertained.

FIG. 6 shows a timing chart for illustrating the aging operation in the circuit shown in FIG. 5. In the aging mode, 7 volts of Vcc and 0 volt of Vss are supplied. Referring to FIGS. 5 and 6, the transmission gate 15 is turned on responsive to a low level signal $\phi 1$ and a high level signal $\overline{\phi 1}$ generated by an inverter. Thus, the ground voltage Vss is supplied to the one electrode 5a of the capacitor via transmission gate 15 as the cell plate voltage Vcp. Simultaneously, an input data signal "1" for aging is supplied to the input buffer 59 shown in FIG. 4 for bringing a selected bit line 1 to the level of the source voltage Vcc. As a result, a higher voltage Vh (=Vcc−Vss) is applied across the two electrodes 5a and 5b of the capacitor 5.

After the impression of this high voltage Vh is continued for a predetermined time, the usual write and read out operations of the DRAM are executed. When the insulator 5c in the capacitor 5 is free of defects, the written data signals are read out correctly. Conversely, when the insulator 5c in the capacitor is defective, correct data signal cannot be read out. The insulating properties of the insulator 5c of the capacitor included in the memory cell can be ascertained by the above described aging test.

In the above example, the ground voltage Vss is used as the cell plate voltage Vcp. However, the source voltage Vcc may also be used as the cell plate voltage. In this case, however, a data signal "0" is supplied to the input buffer 59 shown in FIG. 4 in place of "1" so that a selected one of the bit lines 1 is brought to the level of the ground voltage Vss. Hence, a higher voltage of opposite polarity $-Vh$ is applied across the two electrodes 5a and 5b of the capacitor 5.

As is apparent from the foregoing, it is noted that no terminal is provided in the DRAM for directly applying the cell plate voltage $V_{cp}$ from outside. The reason for this is that an additional terminal must be provided for externally and directly applying the voltage $V_{cp}$, which is not preferable.

In general, for ascertaining the insulating properties of an insulator, it is necessary to apply voltages having two opposite polarities. This may be seen from a thesis publicized by Y. OHJI et al in a Symposium of International Reliability Physics held in 1987 and entitled "RELIABILITY OF NANO-METER THICK MULTI-LAYER DIELECTRIC FILMS ON POLY-CRYSTALLINE SILICON". However, in the conventional DRAMs, only a single polarity of test voltage either Vh or $-Vh$ can be applied to the insulator 5c of the capacitor 5 in the memory cell 8 during the aging test, so that it has not been possible to carry out a complete aging test for DRAMs.

A prior art having particular pertinence to the present invention may be seen in a U.S. Pat. No. 4,527,254 entitled "DYNAMIC RANDOM ACCESS MEMORY HAVING SEPARATED $V_{DD}$ PADS FOR IMPROVED BURN—IN", issued to Ryan et al on July 2, 1985. In this prior art, an external voltage higher than the source voltage is applied to the DRAM during aging to shorten the time involved in aging. However, nothing is said of the polarity of the applied voltage.

An example of prior art having particular pertinence to the present invention is the Japanese Patent Laying-Open No. 232155/1987. In this prior art, a test voltage generator adapted for generating a voltage not less than the source voltage is included in the DRAM so that the voltage applied during aging has only one polarity.

Besides this prior art example, the Japanese Patent Laying-Open No. 192998/1987 also shows another example in which the voltage is impressed during aging has only one polarity.

SUMMARY OF THE INVENTION

It is a primary object of the present invention to make possible more effective aging in DRAMs.

It is another object of the present invention to make possible more reliable aging of the capacitor included in the memory cell of the DRAMs.

It is still another object of the present invention to make possible more reliable checking of the insulating properties of the insulator interposed between two electrodes of the capacitor of a memory cell in a DRAM.

It is a further object to provide a circuit by which dual polarity aging testing can be accomplished without the requirement of external switching or provision of further connection to the DRAMs.

Stated briefly, the dynamic random access memory device of the present invention includes a circuit for applying first and second test voltages having opposite polarities across two electrodes of a capacitor in the memory cell. These first and second test voltages are larger in magnitude than the absolute value of the signal voltage applied across the two electrodes of capacitor means in the usual write mode. The memory device also includes means for receiving external selection signals for selecting one of these first and second test voltages and a selection circuit responsive to the selection signals to select the test voltage to be applied to the capacitor in the memory cell from the test voltage applying circuit.

In operation, the first and second test voltages having opposite polarities are applied across two electrodes of the capacitor means in the memory cell in response to the selection signals. In this manner, the test voltages having opposite polarities are alternately applied to the insulator in the capacitor to provide for achieving a more reliable checking of the insulating properties of the insulator.

The method of operation of the dynamic random access memory device of the present invention includes a step of receiving an external a selection signal for selecting the polarity of the test voltage applied across two electrodes of the capacitor in the memory cell, a step of applying a first test voltage of one polarity across two electrodes of the capacitor in the memory cell in response to the external selection signal, and a step of impressing a second test voltage having the opposite polarity to that of the first test voltage across two electrodes of the capacitor in the memory cell in response to the external selection signal. In this manner, the insulating properties of the insulator provided between the two electrodes of the capacitor in the memory cell can be checked more reliably.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
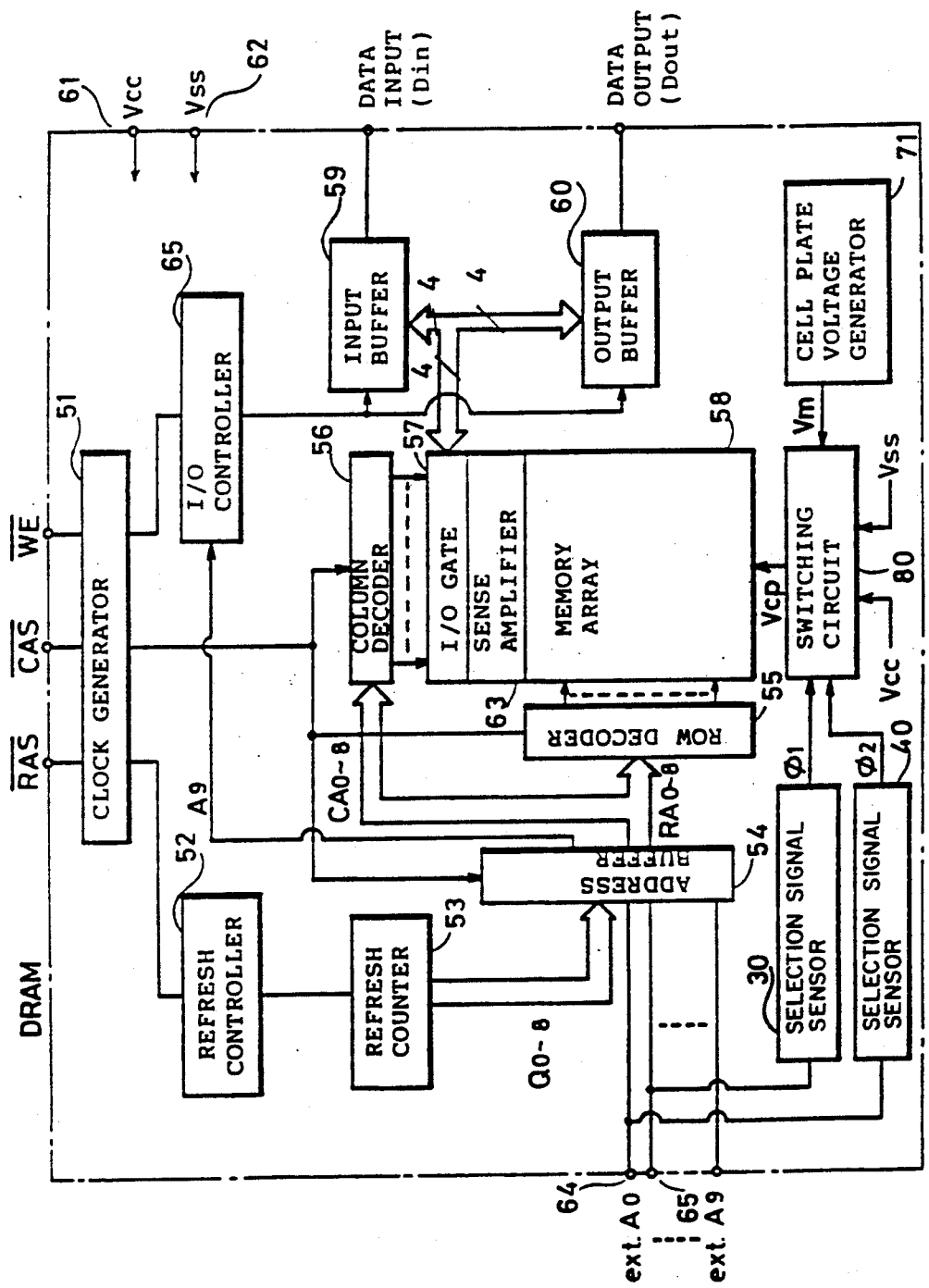
FIG. 2 is a block diagram of a DRAM according to an embodiment of the present invention.
Figure 4:
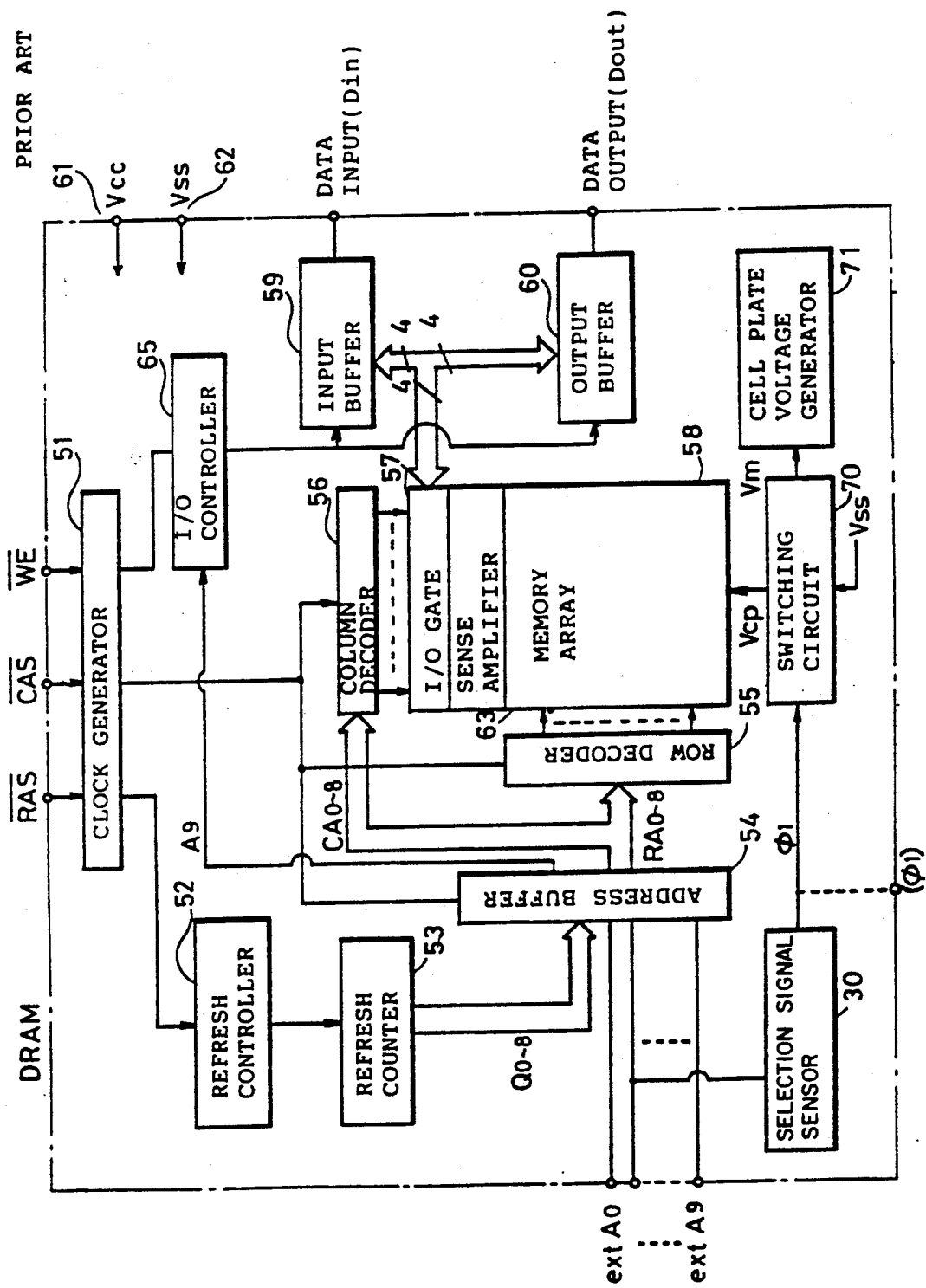
FIG. 4 a block diagram showing an example of a conventional DRAM.
Figure 5:
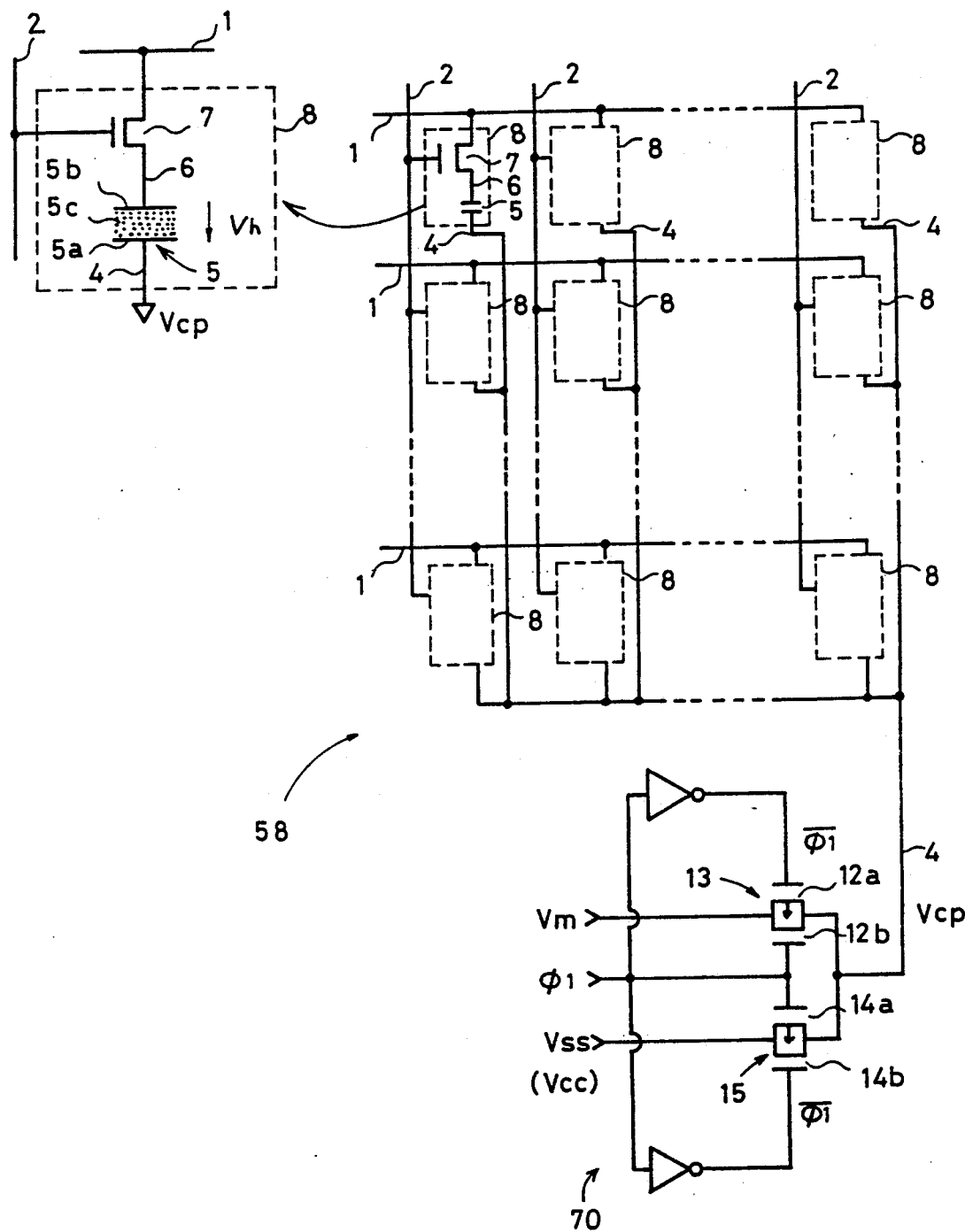
FIG. 5 is a circuit diagram showing a part of a memory array shown in FIG. 4 and a switching circuit.
Figure 6:
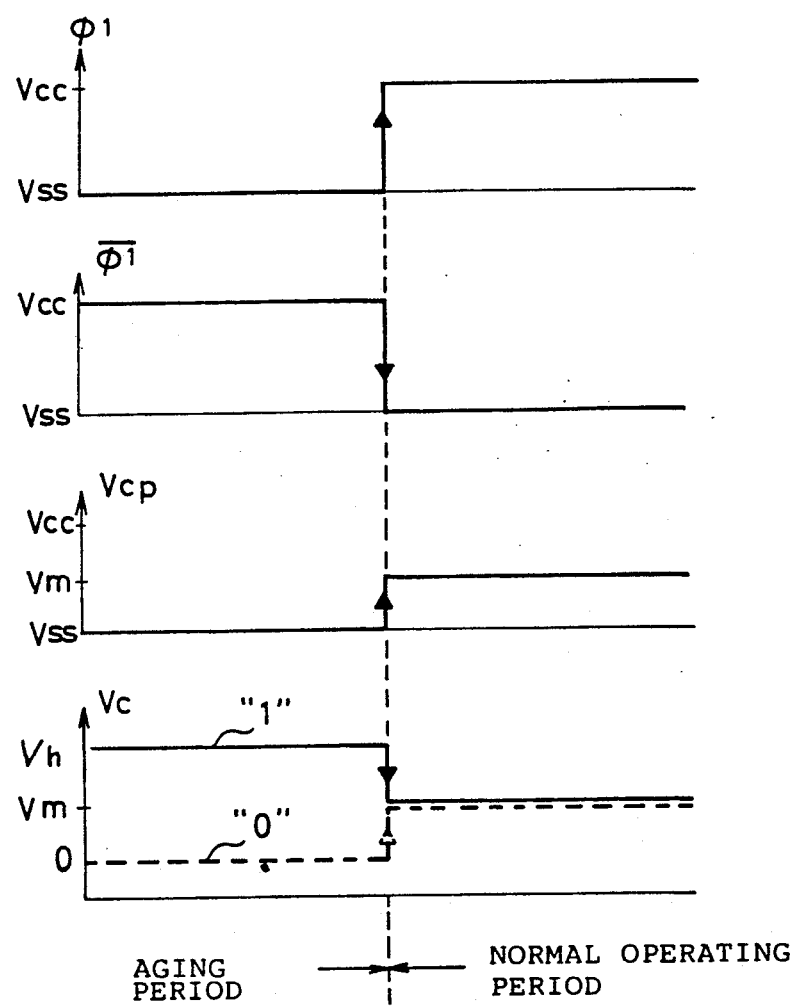
FIG. 6 is a timing chart for illustrating the aging operation in the circuit shown in FIG. 5.

FIG. 2 is a block diagram of a DRAM showing an embodiment of the present invention. Referring to FIG. 2, the DRAM shown therein differs from the conventional DRAM shown in FIG. 4 in the following respect. That is, the DRAM shown in FIG. 2 includes an improved selection circuit 80 connected to receive the source voltage Vcc, the ground voltage Vss and the voltage Vm from a cell plate voltage generator 71, and selectional signal sensors 30 and 40 connected to address input terminals 65 and 64, respectively. These two selectional signal sensors 30 and 40 output selection control signals $\phi 1$ and $\phi 2$, respectively. The selection circuit 80 is connected to receive the signals $\phi 1$ and $\phi 2$. Since the circuitry is otherwise the same as that of the DRAM shown in FIG. 4, the corresponding description is omitted for simplicity.

Figure 1A:
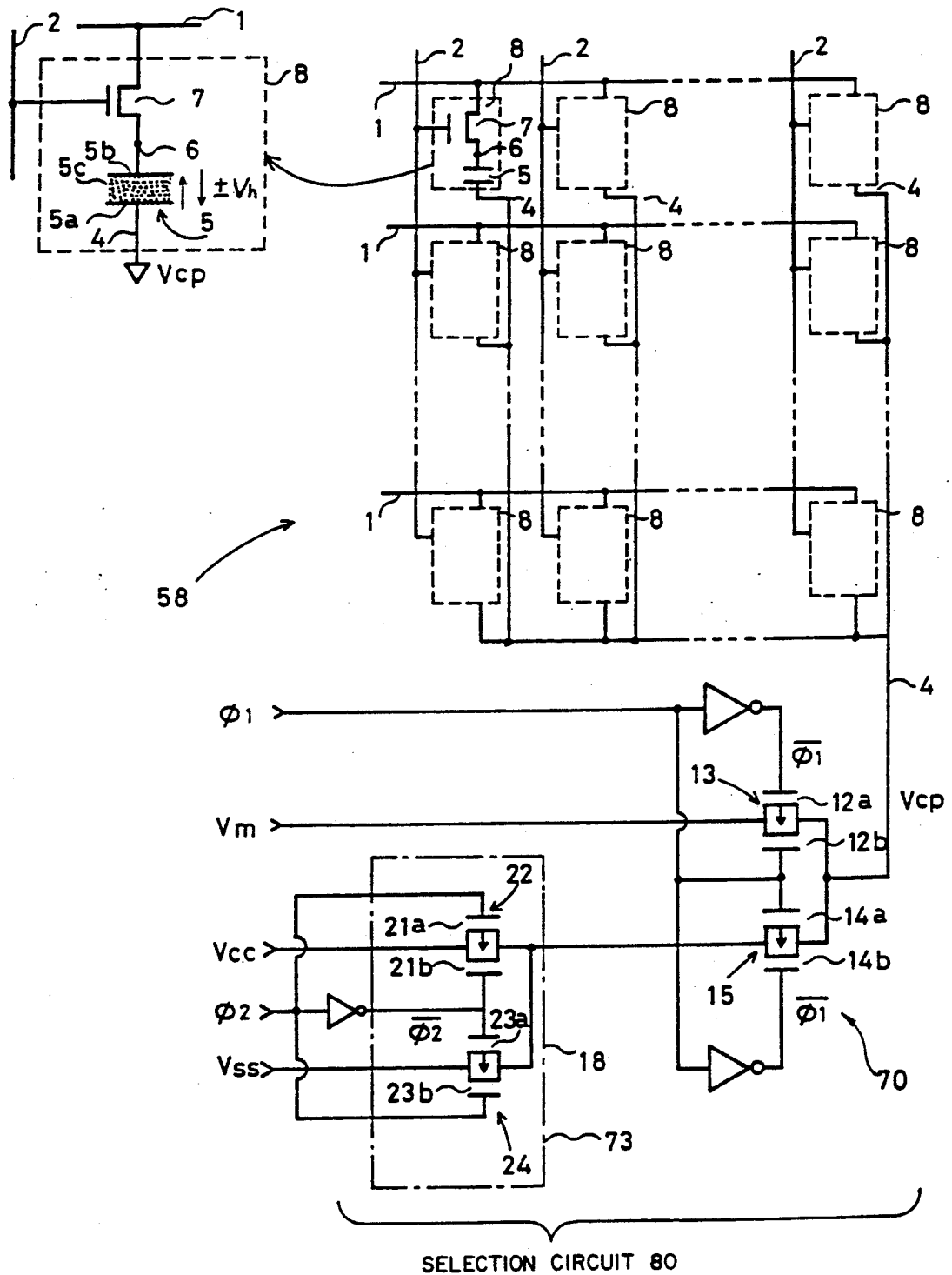
FIG. 1A is a circuit diagram showing a part of a DRAM shown in FIG. 2 according to an embodiment of the present invention.

FIG. 1A is a circuit diagram showing a part of the memory array 58 shown in FIG. 2 and an improved selection circuit 80. Referring to FIG. 1A, the selection circuit 80 includes, in addition to the conventional switching circuit 70, another switching circuit 73. The switching circuit 73 includes a transmission gate 22 for switching control of the source voltage Vcc and a transmission gate 24 for switching control of the ground voltage Vss. The transmission gate 22 includes a parallel connection of conduction paths of a PMOS transistor 21a and an NMOS transistor 21b. The transmission gate 24 includes a PMOS transistor 23a and an NMOS transistor 23b. Each of the transistors 21a and 23b is connected to receive a signal $\phi 2$ from a selection signal sensor 40 shown in FIG. 2. Each of the transistors 21b and 23a has its gate connected to receive an inverted signal $\overline{\phi 2}$ from the selection signal sensor 40. It is noted that the transmission gates 13 and 15 in the switching circuit 70 are controlled by a switching control signal $\phi 1$ from the selection signal sensor 30 shown in FIG. 2.

Figure 1B:
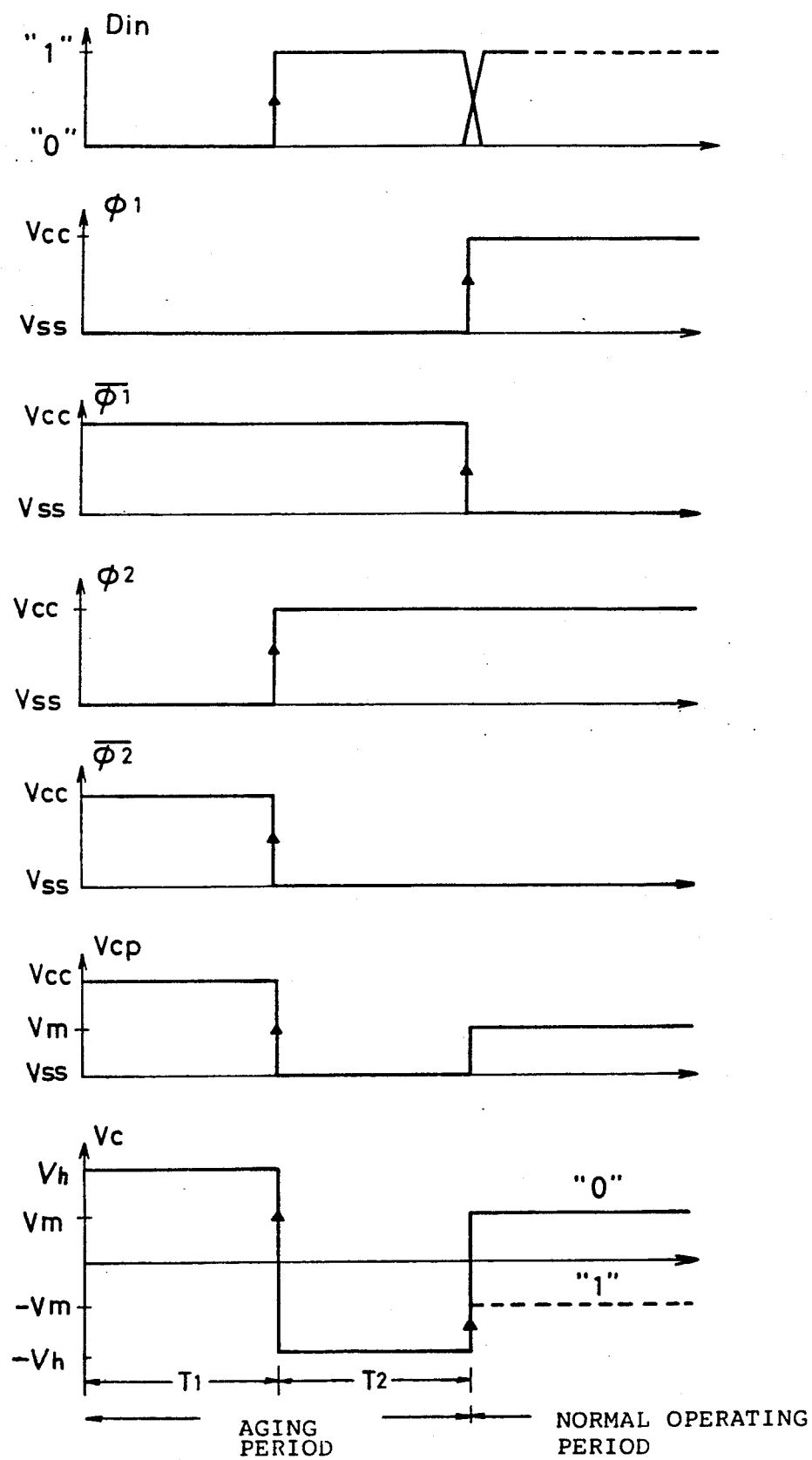
FIG. 1B is a timing chart for illustrating the aging operation in the circuit shown in FIG. 1A.

FIG. 1B shows a timing chart for illustrating the aging operation in the circuit shown in FIG. 1A. The operation of the system is now explained by referring to FIG. 1A and FIG. 1B.

During the usual read out or write modes, 5 volts of Vcc and 0 volt of Vss are supplied. When no external selection signals are applied selectional signal to the terminal 65 shown in FIG. 2 and the selectional signal sensor 30 outputs a high level switching signal $\phi 1$. The transmission gate 13 is turned on in response to this signal $\phi 1$, while the transmission gate 15 is turned off. As a result, the voltage Vm ($=$(Vcc$-$Vss)/2) is applied to one electrode 5a of a capacitor 5 in a memory cell 8 as the cell plate voltage Vcp.

During the aging mode, for example, 7 volts of Vcc and 0 volt of Vss are supplied. An external selection signal is applied to the terminal 65 shown in FIG. 2. A voltage of 9 volts, for example, is applied as the external selection signal to the terminal 65. The detection level of the selectional signal detector 30 is said at about 8.5 volts in advance. The higher voltage sensor 30 is responsive to this higher voltage to output a low level signal $\phi 1$, so that the transmission gate 13 is turned off and the transmission gate 15 is turned on.

During the first half of the aging period T1, the external sectional signal (9 volts) is additionally supplied to a terminal 64 shown in FIG. 2. The selectional signal sensor 40 is responsive to this voltage to output a low level signal $\phi 2$. The transmission gate 22 is turned on responsive to this signal $\phi 2$. Thus, the source voltage Vcc is applied to one electrode 5a of the capacitor 5 in the memory cell 8 via the transmission gates 22 and 15. Simultaneously, a data input signal "0" is supplied to the input buffer 59 shown in FIG. 2, so that the bit line 1 is brought to the ground voltage Vss. The transistor 7 in the memory cell 8 is turned on responsive to the signal from the row decoder 55, so that the other electrode 5b of the capacitor 5 is brought to the ground voltage Vss.

During the second or latter half of the aging period T2, no external selection signal is applied to the terminal 64 shown in FIG. 2. The selection signal sensor 40 thus outputs a high level signal $\phi 2$, so that the transmission gate 22 is turned off, while the transmission gate 24 is turned on. As a result, the ground voltage Vss is applied to one electrode 5a of the capacitor 5 in the memory cell 8 via transmission gate 24 and 15. Simultaneously, a data input signal "1" is supplied to the input buffer 59 shown in FIG. 2 so that the bit line 1 is brought to the source voltage Vcc. The transistor 7 in the memory cell 8 is turned on responsive to the signal from the row decoder 55 so that the other electrode 5b of the capacitor 5 is brought to the source voltage Vcc.

In this manner, as shown in FIG. 1B, voltages $\pm V_h$ ($=\pm$(Vcc$-$Vss)) in the opposite senses are applied across the electrodes of the capacitor 5 during the first and second halves $T_1$ and $T_2$ of the aging period. This permits, the insulating properties of the insulator between the electrodes 5a and 5b of the capacitor 5 to be checked correctly while shortening the time involved in aging.

It is noted that although the switching circuit 80 shown in FIG. 1A is formed of CMOS transistors, it may be formed only by the PMOS transistors or by NMOS transistors.

Figure 3:
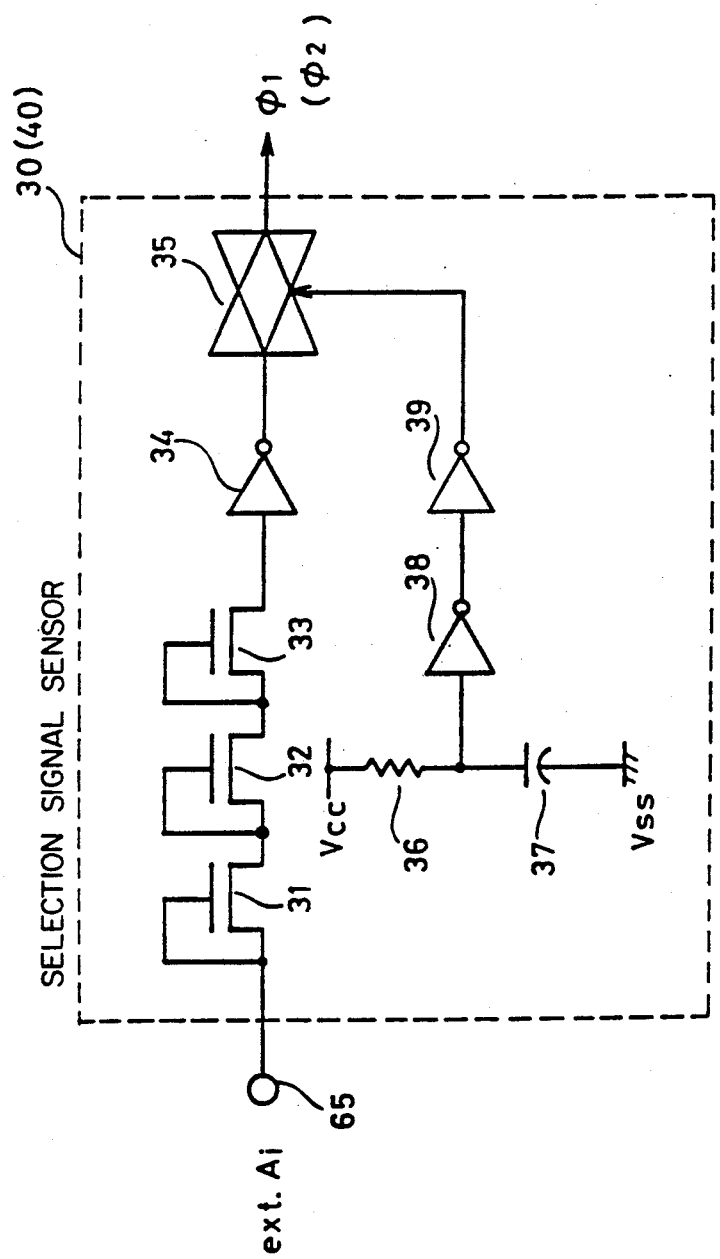
FIG. 3 is a circuit diagram showing an example of a test voltage sensor shown in FIG. 2.

FIG. 3 is a circuit diagram showing an example of the higher voltage sensors 30 or 40 shown in FIG. 2. Referring to FIG. 3, this high voltage sensor 30 includes NMOS transistors 31 to 33 for decreasing the voltage applied to the terminal 65 and an inverter 34 for inverting the decreased voltage, a bilateral gate 35 connected to the output of the inverter 34, a resistor 36 and a capacitor 37 connected in series between the source voltage Vcc and the ground voltage Vss, and cascaded inverters 38 and 39 for outputting the voltage at a node between the resistor 36 and the capacitor 37 with a delay. The output of the inverter 39 is connected to a control input of the bilateral gate 35.

In operation, after a certain time has elapsed since the rising of the source voltage Vcc, a high level voltage signal is applied to a control input of the bilateral gate 35 from the inverter 39. When the external selection signal (9 volts) is applied to the terminal 65, the voltage thereto is decreased by the transistors 31 to 33. Hence, the usual high level voltage is applied to the inverter 34, so that the inverter 34 outputs the low level voltage. As a result, the bilateral gate 35 outputs a low level voltage signal $\phi 1$ after a certain time has elapsed since the rising of the source voltage Vcc.

When the external selection signal is not applied to the terminal 65, the inverter 34 outputs the high level voltage, so that the high level voltage signal $\phi 1$ is outputted from the bilateral gate 35.

Although the source voltage Vcc of 7 volts and the ground voltage Vss are used for aging in the above embodiment, the present invention is not limited to these voltages. For example, a voltage higher than the source voltage Vcc may be used in place of the source voltage, while a voltage lower than the ground voltage Vss may be used in place of the ground voltage.

Also, in the above described embodiment, an example has been shown in which the voltage Vm ($=$(Vcc$-$Vss)/2) is outputted from the cell plate voltage generator 71. However, it only suffices that the voltage $V_m$ be constant and the above specific value is not limitative of the present invention.

It may be seen from the foregoing that the test voltages having opposite polarities are alternately applied by external control across the electrodes 5a and 5b of the capacitor in the memory cell 8 shown in FIG. 1A, so that the insulating properties of the insulator 5c provided between the two electrodes 5a and 5b can be set more accurately. Thus it becomes possible to perform a more reliable aging test of memory cells included in a DRAM, that is, that of the DRAM.

Although the present invention has been described and illustrated in detail, it is clearly understood that the same is by way of illustration and example only and is not to be taken by way of limitation, the spirit and scoped of the present invention being limited only by the terms of the appended claims.

What is claimed is:

1. A selection circuit for selecting test voltages on a dynamic random access memory having a plurality of memory cells, each memory cell having a plurality of memory cells, each memory cell including one transistor and one capacitor with one electrode thereof connected to said transistor, comprising:

first switching means having first and second input nodes, an output node and a control node,
   the first input node connected to a first potential, the second input node connected to a second potential, the control node connected to receive a first selection signal for selectively outputting one of said first and second potentials; and
   second switching means having first and second input nodes, an output node and a control node,
   the first node connected to a third potential, the second input node connected to the output node of said first switching means, the control node connected to receive a second selection signal for selectively outputting one of said third potential and the potential presented at the output node of said first switching means, said output node of said second switching means connected to the other electrode of said capacitor.

2. The switching circuit according to claim 1, wherein
   said first potential is a high potential, said second potential is a ground potential and said third potential is an intermediate potential between said first and second potentials.

3. The switching circuit according to claim 1, wherein
   said control node of said first switching means includes first and second control nodes;
   said first switching means includes a first parallel connection of a first n-type MOS transistor and a first p-type transistor connected between said first input node and the output node,
   said second switching means includes a second parallel connection of a second n-type MOS transistor and a second p-type transistor connected between second input node and the output node,
   said first n-type transistor and said second p-type transistor having the gate electrodes connected to the first control node, and
   said second n-type transistor and said first p-type transistor having the gate electrodes connected to the second node.

* * * * *